(12) United States Patent
Carpenter, Jr. et al.

(10) Patent No.: US 8,206,836 B2
(45) Date of Patent: Jun. 26, 2012

(54) TIE-BAR CONFIGURATION FOR LEADFRAME TYPE CARRIER STRIPS

(75) Inventors: Loyde M. Carpenter, Jr., Palm Bay, FL (US); Randolph Cruz, Melbourne, FL (US); Nikhil Kelkar, Saratoga, CA (US)

(73) Assignee: Intersil Americas, Inc., Milpitas, CA (US)

( * ) Notice: Subject to any disclaimer, the term of this patent is extended or adjusted under 35 U.S.C. 154(b) by 186 days.

(21) Appl. No.: 12/699,811

(22) Filed: Feb. 3, 2010

(65) Prior Publication Data

US 2011/0033724 A1 Feb. 10, 2011

Related U.S. Application Data

(60) Provisional application No. 61/231,998, filed on Aug. 6, 2009.

(51) Int. Cl.
*H01L 23/495* (2006.01)
*H05K 13/04* (2006.01)

(52) U.S. Cl. ........................................ 428/571; 428/595

(58) Field of Classification Search .................. 257/670, 257/676; 438/121, 123; 428/571
See application file for complete search history.

(56) References Cited

U.S. PATENT DOCUMENTS
4,252,864 A * 2/1981 Coldren ........................ 428/571
6,791,184 B2 * 9/2004 Deeney et al. ................ 257/726

FOREIGN PATENT DOCUMENTS
JP 2002299879 A * 10/2002
* cited by examiner

*Primary Examiner* — Jennifer McNeil
*Assistant Examiner* — Adam Krupicka
(74) *Attorney, Agent, or Firm* — Wallace G. Walter

(57) ABSTRACT

A conductive clip having a riser or post formed along a side thereof includes a notch or opening formed in the riser or post to create a first riser or post section and second riser or post section separated by the notch or opening through which a tiebar extends. The conductive clip organization is will suited for formation as elongated strips of such conductive clips for automated machine assembly of the conductive clips in an integrated circuit package context.

16 Claims, 6 Drawing Sheets

TIE-BAR CONFIGURATION FOR LEADFRAME TYPE CARRIER STRIPS

CROSS-REFERENCE TO RELATED APPLICATION

This application claims the benefit of U.S. Provisional Patent Application 61/231,998 filed Aug. 6, 2009 by the applicants herein, the disclosure of which is incorporated herein by reference.

BACKGROUND

The present invention relates generally to the manufacture of integrated circuit packages and, more particularly, to the manufacture and packaging of conductive clips for subsequent assembly into or onto a die or dies as used in integrated circuit packages, and, still more particularly, to elongated strips of conductive clips in which successive clips are transferred therefrom on a clip-by-clip basis via a transfer machine into or onto an integrated circuit package for assembly thereto or thereon.

In the manufacture of electronic components, including integrated circuits, the various sub-components (circuit dies, discrete components, conductive clips, etc.) are often supplied on or as part of an elongated strip that is often wound on a reel by the manufacturer with that reel then supplied to the customer. For example, integrated circuit dies are often supplied by the manufacturer as a paper strip or tape upon which the dies are adhered in a uniformly spaced apart relationship. The paper strip or tape is supplied to a pick-and-place machine which picks successive dies from the paper strip and places the so-picked dies on a leadframe or other substrate of an integrated circuit package. In addition to the paper strip or tape arrangement, other types of parts, including conductive clips, are formed on blank metallic strips by one or more die-cutting or die-stamping steps to form a succession of properly shaped and spaced-apart conductive clips on the metallic strip. As in the case of the paper tape scheme, the metallic strip can be wound upon a reel for delivery to the customer.

In general, the paper tape system arrangement is more expensive to manufacture and use, where conductive clips are involved, relative to arrangements in which a conductive clip is formed as a part of an elongated metallic strip.

FIGS. 1A and 1B illustrate a known conductive clip 10 of the type used, for example, in MOSFET power inverters; typically, these clips are used to make contact with the planar source or drain of a V-FET and effect an electrical connection to a conducive pad on a leadframe or other conductive part of a substrate. As shown, the conductive clip 10 includes a planar contact portion 12 and a riser or post 14 that is bent at some angle (e.g., about 90°) relative to the contact portion 12 of the conductive clip 10.

In a typical application, the planar contact portion is mounted atop a MOSFET to make electrical and mechanical contact with a source or drain thereof with the riser or post 14 extending to a contact pad on a leadframe or other substrate (not shown). The conductive clip 10 is typically fabricated from a conductive metal or alloy such as copper or a copper alloy.

As shown in FIG. 1C, the conductive clips 10 are often manufactured by subjecting an elongated strip of the metal starting-material to a succession of die-stamping steps that punch out material to form upper and lower rails 16 with appropriate sprocket holes 18 and to shape the conductive clips 10 with an additional metal-stamping step or steps to form the risers or posts 14. As shown, the conductive clips 10 are connected to the upper and lower rails by tiebars 20; while the example shown shows two tiebars 20, additional tiebars may be used.

FIGS. 1D and 1E are perspective views showing a conductive clip 10 and its tiebars 20. While not shown, each tiebar 20 can have a portion thereof that has a reduced cross-section or a reduced thickness or a score-line to allow the tiebars 20 to fracture or separate thereat when the conductive clip is pulled therefrom by a machine (not shown) for subsequent placement onto, e.g., a MOSFET chip of the type used in power inverters.

In general, the strips of so formed conductive clips 10 are wound on a reel (not shown) and supplied to the customer who often use a pick-and-place machine or robot to remove the conductive clips and place them into position in an integrated circuit undergoing assembly.

SUMMARY

A conductive clip having a laterally extending riser or post and a longitudinally extending riser or post and tiebars extending laterally therefrom includes an opening, notch, gap, or opening formed in at least one of the risers or posts to bifurcate the riser or post to create an opening through which a tiebar can pass. The conductive clip organization is well suited for creating elongated strips of such conductive clips for automated machine assembly of the conductive clips in an integrated circuit package context.

DESCRIPTION OF THE PREFERRED EMBODIMENT

Figure 1A:
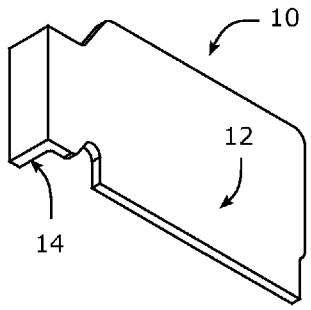
FIGS. 1A and 1B are perspective views of a known type of conductive clip having a post or riser formed along a lateral edge thereof.
Figure 1B:
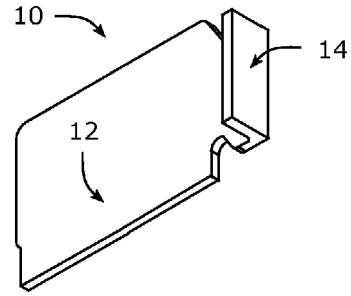

FIGS. 2A, 2B, 2C, and 2D illustrate a variant of the conductive clip discussed above and is designated herein by the reference character 100. As shown, the conductive clip 100 includes a planar contact portion 102 and a first riser or post 104 formed along a lateral side and which is bent at some angle (e.g., usually about 90°) relative to the plane of the contact portion 102 of the conductive clip 100. Additionally, the conductive clip 100 includes a riser or post 106 formed along a longitudinal side thereof that, in a manner similar to the riser or post 104, is similarly bent at some angle (e.g., usually about 90°) relative to the plane of the contact portion 102.

Figure 1C:
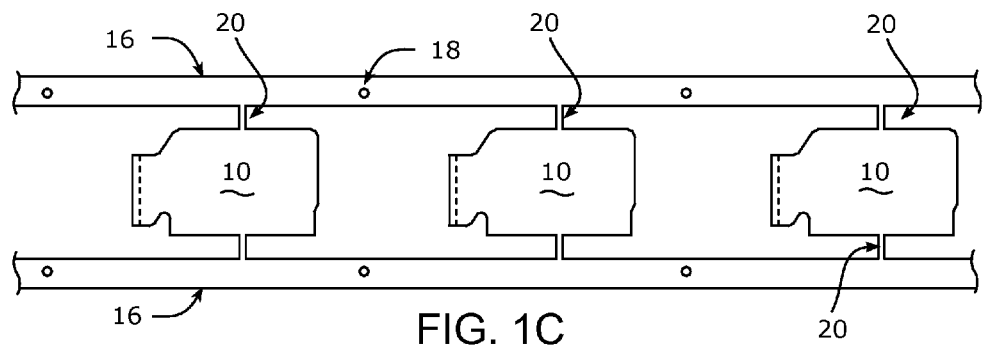
FIG. 1C is a plan view of a portion of a strip of conductive clips of the type shown in FIGS. 1A and 1B.
Figure 1D:
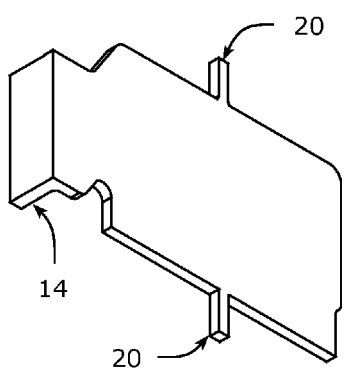
FIGS. 1D and 1E are perspective views of the conductive clips of FIGS. 1A and 1B showing tiebars extending laterally therefrom.
Figure 1E:
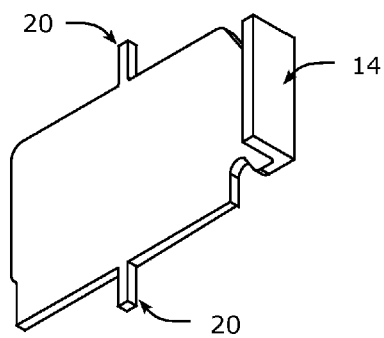
Figure 2A:
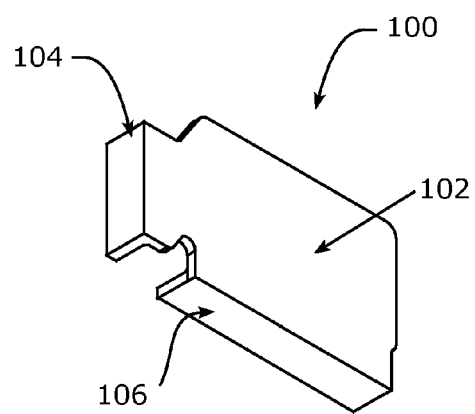
FIGS. 2A, 2B, 2C, and 2D are perspective views of a type of conductive clip having a riser or post formed along a lateral edge and, additionally, another riser or post extending along a longitudinal edge.
Figure 2B:
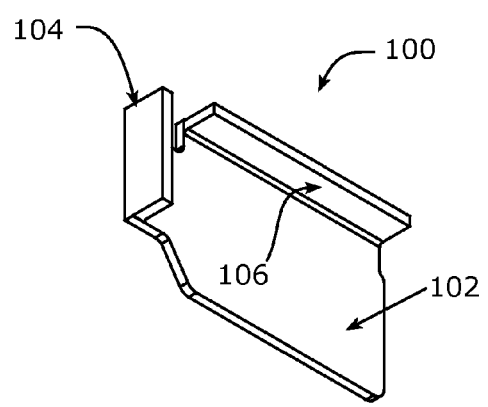
Figure 2C:
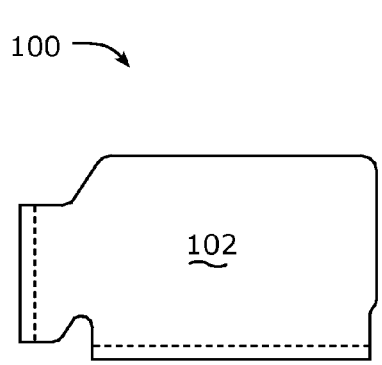
Figure 2D:
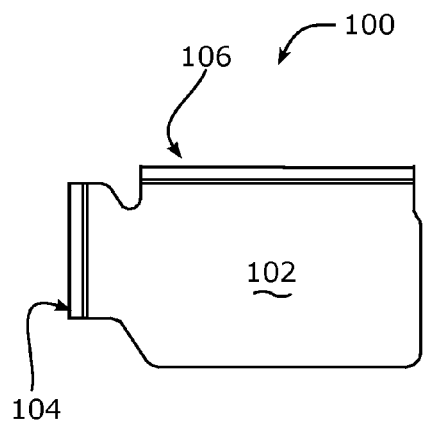
Figure 3A:
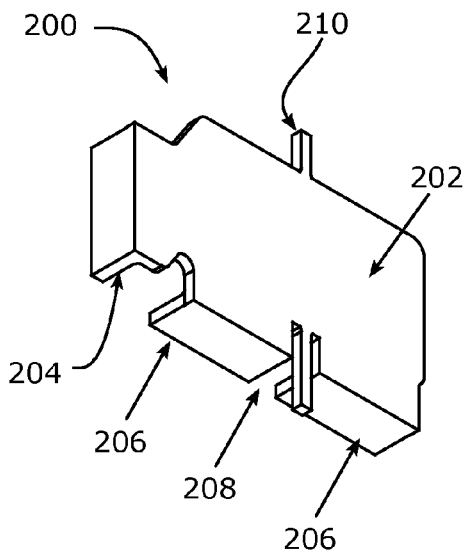
FIGS. 3A, 3B, 3C, and 3D are perspective views of a type of conductive clip having a lateral-edge post or riser and a longitudinal-edge post or riser with tiebars extending laterally therefrom.
Figure 3B:
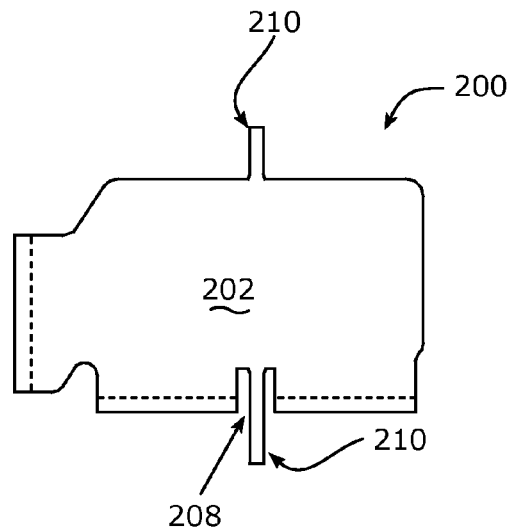
Figure 3C:
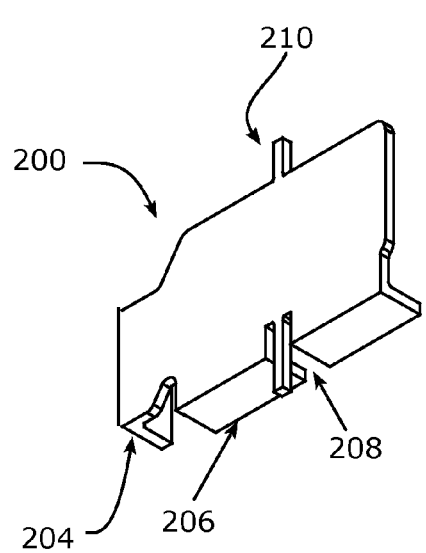
Figure 3D:
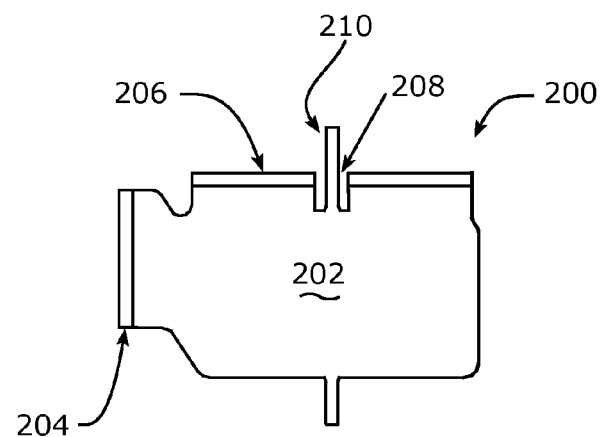

Because the conductive clips 100 of FIGS. 2A, 2B, 2C, and 2D have both lateral posts (viz., 104) and longitudinal posts (viz., 106), conventional die-stamping operations cannot form laterally extending tiebars in a manner similar to that shown in FIGS. 1C-1E.

FIGS. 3A, 3B, 3C, and 3D illustrate a conductive clip 200 that addresses the problem of the conductive clip 100 by a creating tiebar 210 on that side of the clip that includes a riser or post. As shown, the conductive clip 200 includes a planar contact portion 202 and a first riser or post 204 formed or along a lateral side that is bent at some angle (e.g., about 90°) relative to the contact portion 202 of the conductive clip 200 and another riser or post 206 along one longitudinal side thereof that is interrupted by an opening, gap, notch, or slot 208 to define an open space or clearance space on each side of a tiebar 210. The notch or slot 208 effectively bifurcates the riser or post into first and second spaced-apart sections so that the conductive clip 200 includes laterally extending tiebars 210 in substantially the same plane and location on the contact portion 202 as that for the conductive clip shown in FIGS. 1D and 1E.

Figure 4:
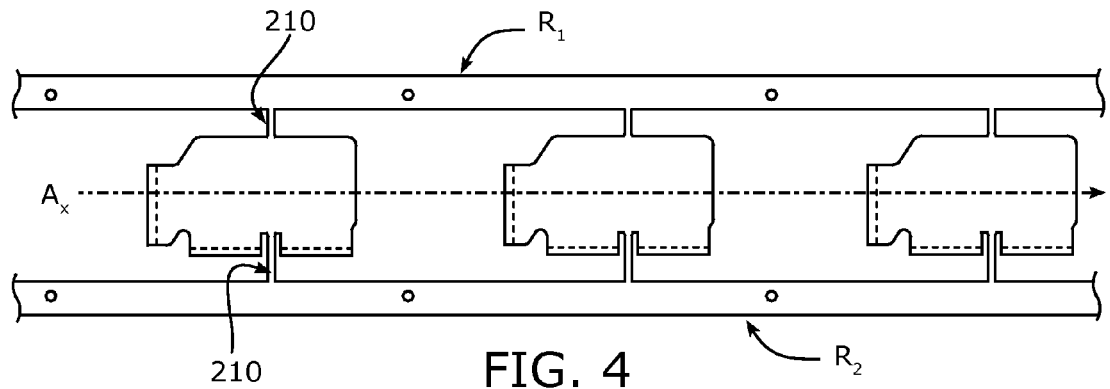
FIG. 4 is a plan view of a portion of a strip of conductive clips of the types shown in FIGS. 3A-3D.

As shown in FIG. 4, the conductive clips 200 can be formed as part of a strip of such clips along a longitudinally extending axis $A_x$ in which the tiebars 210 support the clips 200 between first and second spaced rails $R_1$ and $R_2$ in a manner consistent with FIG. 1C as discussed above.

Figures 4A, 4B, 4C:
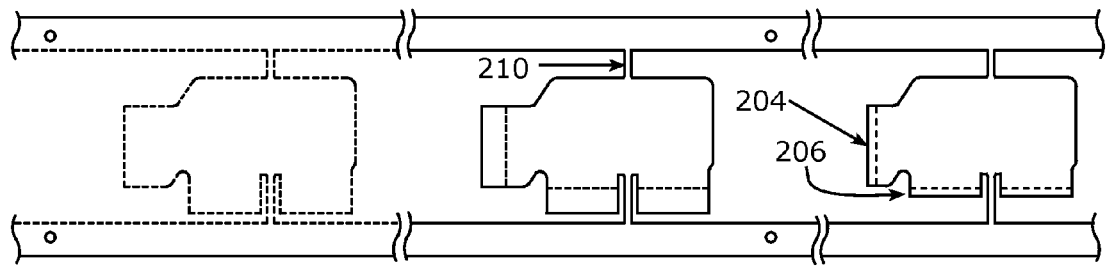
FIGS. 4A-4C illustrate one example of a multi-step process for manufacturing the structure shown in FIG. 4.

FIGS. 4A, 4B, and 4C illustrate one exemplary metal-forming sequence for fabricating a strip of the type shown in FIG. 4. In FIG. 4A, a starting strip of metal is subject to a die-cutting or metal-punching step in which the material between the to-be-formed clips is removed to leave a clip preform as shown in FIG. 4B. In the preform, the material that is to become the risers or posts remains substantially in the same plane of the strip material, with their respective bend lines (unnumbered) shown in dotted-line. Thereafter, a metal-stamping step (FIG. 4C), bends the material along the bend lines to form the risers or posts 204 and 206. If desired, a preferential separation line or region (not shown) in each tiebar 210 can be formed by a score line, a reduced-thickness zone, and/or a reduced-width zone so that each tiebar 210 will reliably separate from its rails during the subsequent pick-and-place step.

Figure 5:
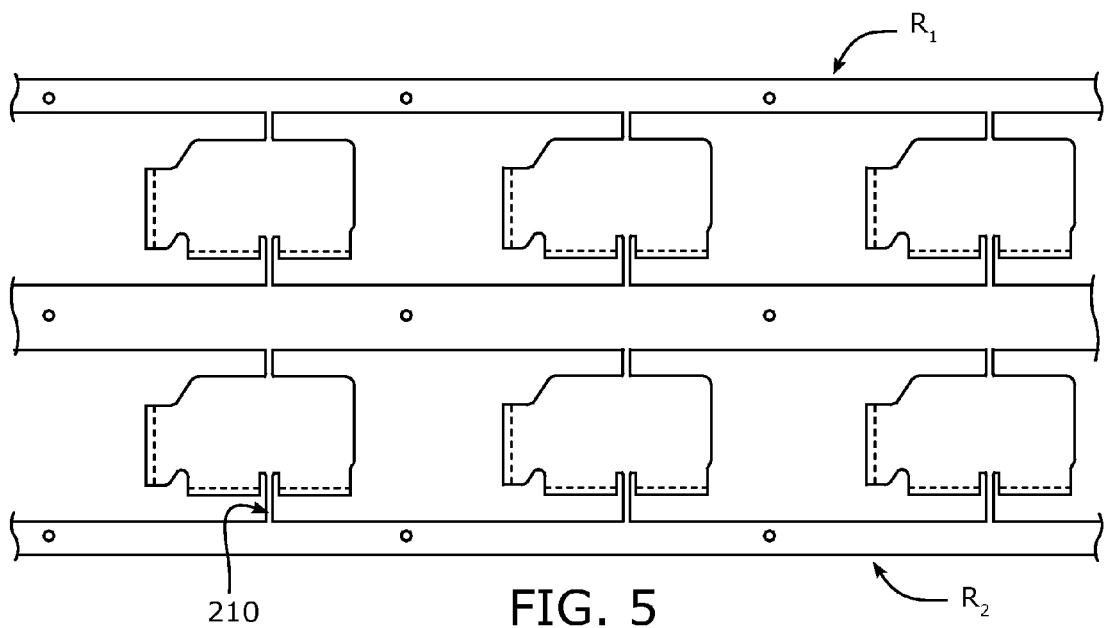
FIG. 5 is a plan view of a portion of a double-row strip of conductive clips of the types shown in FIGS. 3A-3D.

If desired and as shown in FIG. 5, a double-row of clips 200 can be formed between an upper first rail $R_1$, a lower second rail $R_2$, and an intermediate rail (unnumbered).

Figure 6:
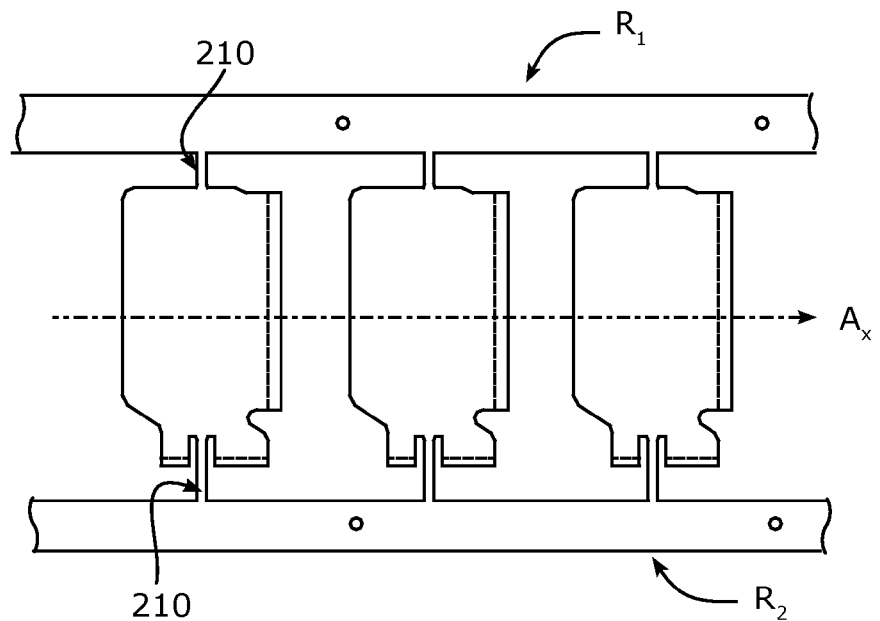
FIG. 6 is a plan view of a portion of a strip of conductive clips rotated ninety degrees relative to those shown in FIGS. 4 and 5.
Figure 7:
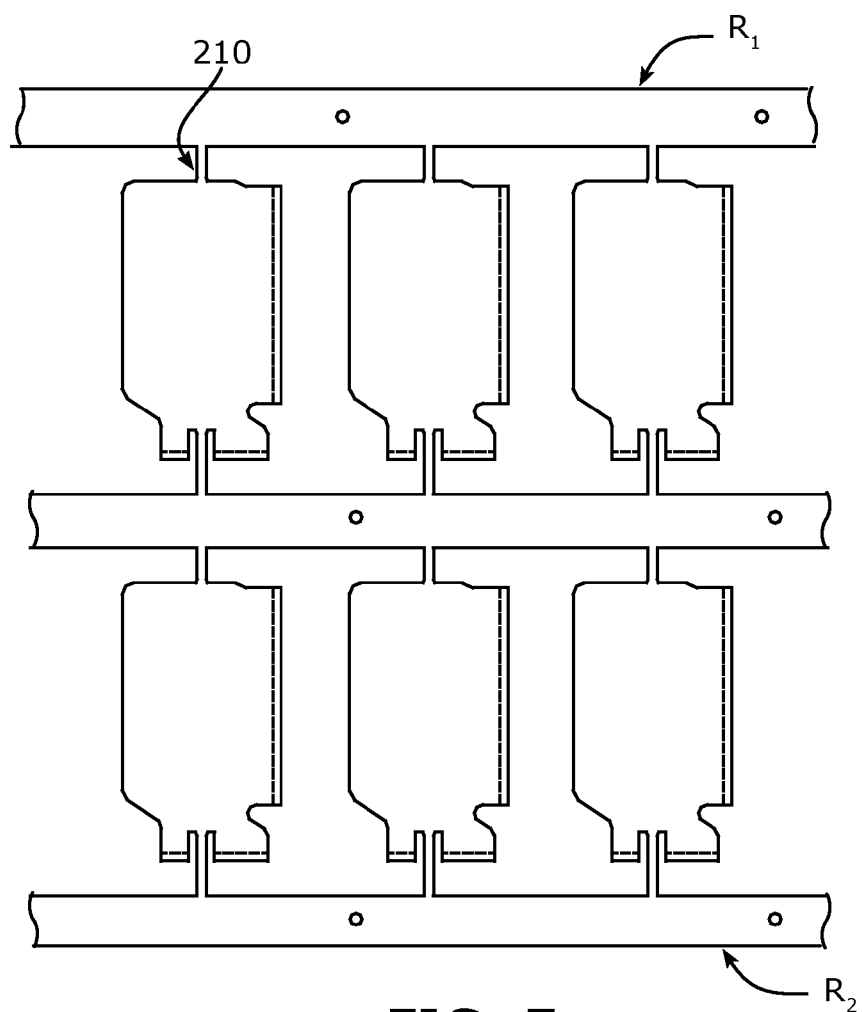
FIG. 7 is a plan view of a portion of a double-row strip of conductive clips of the types shown in FIG. 6.

If desired and as shown in FIG. 6, the conductive clips 200 can be rotated ninety degrees from that shown in FIG. 4 or 5 to form a more densely packed strip. If desired and in a manner analogous to that shown in FIG. 5, a double-row of clips 200 can be formed between an upper first rail $R_1$, a lower second rail $R_2$, and an intermediate rail (unnumbered).

Figure 8:
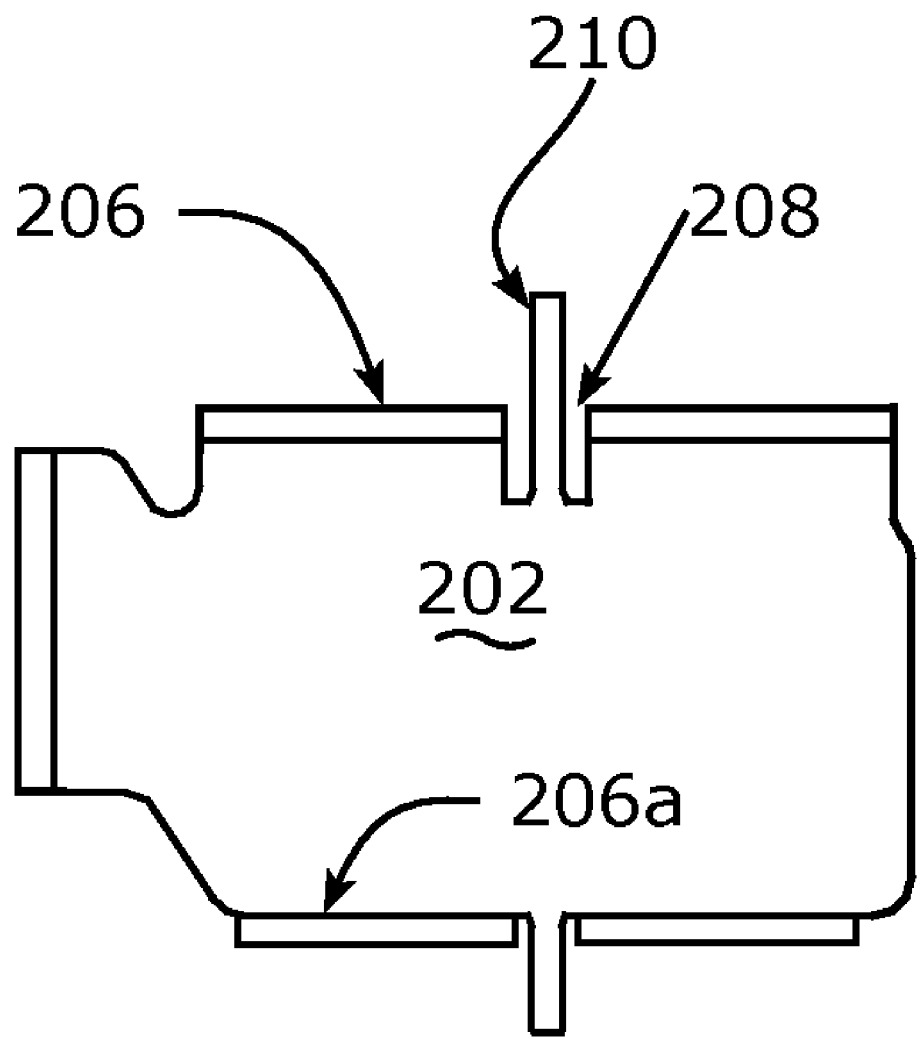
FIG. 8 illustrates a variant of the exemplary conductive clip.

In the above described embodiments the conductive clip is shown as having an approximately rectangular planform with laterally and longitudinally aligned risers or posts; as can be appreciated other planforms and alignments for the risers or posts are not excluded. The preferred embodiments have been described as having one lateral and one longitudinal riser or post, as can be appreciated and as shown at 206a in FIG. 8, a conductive clip can include a riser or post along each opposite longitudinal (and/or lateral) edge. Additionally, the bottom end each riser or post that contacts a conductive pad on the leadframe or substrate can be formed with an optional "foot" (not shown) to enlarge the contact area. While the notch or slot 208 has been shown as extending into the planar portion 202 of the clip, as represented by the upper tiebar 210 in FIG. 8, the notch or slot 208 can be formed so as not to extend into the planar portion of the clip, as shown on the lower side of the clip shown in FIG. 8.

As will be apparent to those skilled in the art, various changes and modifications may be made to the illustrated embodiment of the present invention without departing from the spirit and scope of the invention as determined in the appended claims and their legal equivalent.

The invention claimed is:

1. A conductive clip for use in the fabrication of an integrated-circuit package, comprising:
   a conductive clip having a planar portion defined by plural sides;
   a post formed along at least a first side of said planar portion and aligned at an angle relative to the planar portion, the post bifurcated by an opening positioned intermediate to the ends of said post;
   a first tiebar extending from the planar portion of the conductive clip from the opening; and
   a second tiebar extending from the planar portion of the conductive clip from a side of the planar portion other than said first side, portions of said planar portion, said first tiebar, and said second tiebar sharing a common plane.

2. The conductive clip of claim 1, wherein said post is formed at an angle of about ninety degrees relative to the planar portion.

3. The conductive clip of claim 1, further comprising a second post formed along a side of said planar portion other than said first side and aligned at an angle relative to the planar portion.

4. The conductive clip of claim 3, wherein said second post is formed at an angle of about ninety degrees relative to the planar portion.

5. A conductive clip for use in the fabrication of an integrated-circuit package, comprising:
   a conductive clip having a planar portion defined by lateral sides and longitudinal sides;
   a post formed along a first side of said lateral or longitudinal sides and aligned at an angle relative to the planar portion, the post bifurcated by a notch positioned intermediate to the ends of said post;
   a first tiebar extending from the planar portion of the conductive clip from the notch; and
   a second tiebar extending from the planar portion of the conductive clip from one of said lateral or longitudinal sides other than said first side, portions of said planar portion, said first tiebar, and said second tiebar sharing a common plane.

6. The conductive clip of claim 5, wherein said post is formed at an angle of about ninety degrees relative to the planar portion.

7. The conductive clip of claim 5, further comprising a second post formed along one of said lateral or longitudinal sides other than said first side and aligned at an angle relative to the planar portion.

8. The conductive clip of claim 7, wherein said second post is formed at an angle of about ninety degrees relative to the planar portion.

9. A conductive clip for use in the fabrication of an integrated-circuit package, comprising:
- a conductive clip having a planar portion defined by plural sides;
- a post formed along at least a first side of said planar portion and aligned at an angle relative to the planar portion, the post bifurcated into a first and a second section by a gap positioned intermediate to the ends of said post;
- a first tiebar extending from the planar portion of the conductive clip from the gap between said first and second sections of said post; and
- a second tiebar extending from the planar portion of the conductive clip from a side of said planar portion other than said first side, portions of said planar portion, said first tiebar, and said second tiebar sharing a common plane.

10. The conductive clip of claim 9, wherein said post is formed at an angle of about ninety degrees relative to the planar portion.

11. The conductive clip of claim 9, further comprising a second post formed along a side of said planar portion other than said first side and aligned at an angle relative to the planar portion.

12. The conductive clip of claim 11, wherein said second post is formed at an angle of about ninety degrees relative to the planar portion.

13. A plurality of connected conductive clips for use in the fabrication of an integrated-circuit package, comprising:
- an elongated strip defined by at least first and second spaced-apart rails;
- at least a first and at least a second conductive clip spaced apart along said first and second rails, each conductive clip having a planar portion defined by plural sides and a post formed along at least a first side of said planar portion and aligned at an angle relative to the planar portion, the post bifurcated by a gap positioned intermediate to the ends of said post;
- a first tiebar extending from the planar portion of the conductive clip from the gap and connected to one of said first and second rails; and
- a second tiebar extending from the planar portion of the conductive clip from a side of said planar portion other than said first side and connected to the other of said first and second rails, portions of said planar portion, said first tiebar, and said second tiebar sharing a common plane.

14. The plurality of conductive clips of claim 13, wherein each of said posts are formed at an angle of about ninety degrees relative to the planar portion.

15. The plurality of connected clips of claim 13, the conductive clips further comprising a second post formed along a side of said planar portion other than said first side and aligned at an angle relative to the planar portion.

16. The plurality of conductive clips of claim 15, wherein each of said second posts are formed at an angle of about ninety degrees relative to the planar portion.

* * * * *